(12) United States Patent
Hoekman et al.

(10) Patent No.: US 12,124,073 B2
(45) Date of Patent: Oct. 22, 2024

(54) METHOD OF FABRICATING DIFFRACTIVE BACKLIGHT

(71) Applicant: LEIA INC., Menlo Park, CA (US)

(72) Inventors: Thomas Hoekman, Menlo Park, CA (US); David A. Fattal, Menlo Park, CA (US); Ming Ma, Menlo Park, CA (US); Zhen Peng, Menlo Park, CA (US)

(73) Assignee: LEIA Inc., Menlo Park, CA (US)

( * ) Notice: Subject to any disclaimer, the term of this patent is extended or adjusted under 35 U.S.C. 154(b) by 264 days.

(21) Appl. No.: 17/509,036

(22) Filed: Oct. 24, 2021

(65) Prior Publication Data

US 2022/0043200 A1     Feb. 10, 2022

Related U.S. Application Data

(63) Continuation of application No. PCT/US2020/029986, filed on Apr. 25, 2020.
(Continued)

(51) Int. Cl.
*F21V 8/00* (2006.01)
*B29D 11/00* (2006.01)
(Continued)

(52) U.S. Cl.
CPC ...... *G02B 6/0065* (2013.01); *B29D 11/00769* (2013.01); *G02B 6/0036* (2013.01);
(Continued)

(58) Field of Classification Search
CPC .. G02B 6/0065; G02B 6/0036; G02B 6/0051; G02B 6/0055; G02B 6/0053;
(Continued)

(56) References Cited

U.S. PATENT DOCUMENTS 7,215,850 B2     5/2007 Maisenhoelder et al.
9,128,226 B2     9/2015 Fattal et al.
(Continued)

FOREIGN PATENT DOCUMENTS

CA     3136673     11/2020
CA     3136670     4/2024
(Continued)

OTHER PUBLICATIONS

Nano (Nanoimprint lithography), Retrieved from "https://en.wikipedia.org/w/index.php?title=Nanoimprint_lithography&oldid=1186194394" on Jan. 18, 2024 (Year: 2005).*
(Continued)

*Primary Examiner* — S. Behrooz Ghorishi
(74) *Attorney, Agent, or Firm* — .Schwegman Lundberg & Woessner, P.A.

(57) ABSTRACT

Fabricating a diffractive backlight employs a universal grating and selects a portion of the universal grating using a reflective island to define a grating element, a reflective diffraction grating element of the diffractive backlight including the grating element and the reflective island. A method of fabricating a diffractive backlight includes forming the universal grating, forming the reflective island, and selecting a portion of the universal grating using the reflective island to define the grating element. The method of fabricating a diffractive backlight may include forming the reflective island on a light guide surface and forming the universal grating over the reflective island. Alternatively, the method of fabricating a diffractive backlight may include forming the universal grating on the light guide surface and forming the reflective island over the universal grating.

9 Claims, 11 Drawing Sheets

Related U.S. Application Data

(60) Provisional application No. 62/839,736, filed on Apr. 28, 2019.

(51) Int. Cl.
  *G03F 7/00* (2006.01)
  *G03F 7/11* (2006.01)
  *G03F 7/20* (2006.01)

(52) U.S. Cl.
  CPC ......... *G02B 6/0051* (2013.01); *G02B 6/0055* (2013.01); *G03F 7/0002* (2013.01); *G03F 7/001* (2013.01); *G03F 7/11* (2013.01); *G03F 7/2008* (2013.01)

(58) Field of Classification Search
  CPC ............ G02B 6/0038; B29D 11/00769; G03F 7/0002; G03F 7/001; G03F 7/11; G03F 7/2008; G02F 1/133504; G02F 2201/305; G02F 2203/22
  See application file for complete search history.

(56) References Cited

U.S. PATENT DOCUMENTS

| | | | |
|---|---|---|---|
| 9,201,270 | B2 | 12/2015 | Fattal et al. |
| 9,298,168 | B2 | 3/2016 | Taff et al. |
| 9,389,415 | B2 | 7/2016 | Fattal et al. |
| 9,459,461 | B2 | 10/2016 | Santori et al. |
| 9,557,466 | B2 | 1/2017 | Fattal |
| 9,785,119 | B2 | 10/2017 | Taff et al. |
| 10,345,505 | B2 | 7/2019 | Fattal |
| 10,649,128 | B2 | 5/2020 | Fattal et al. |
| 10,712,501 | B2 | 7/2020 | Fattal |
| 10,830,939 | B2 | 11/2020 | Fattal et al. |
| 10,838,134 | B2 | 11/2020 | Fattal et al. |
| 10,928,677 | B2 | 2/2021 | Aieta et al. |
| 10,942,307 | B2 | 3/2021 | Li et al. |
| 10,948,647 | B2 | 3/2021 | Fattal |
| 11,048,036 | B2 | 6/2021 | Ma et al. |
| 2004/0169929 | A1 | 9/2004 | Sato et al. |
| 2009/0296193 | A1 | 12/2009 | Bita et al. |
| 2009/0322986 | A1 | 12/2009 | Wei et al. |
| 2012/0200807 | A1 | 8/2012 | Wei et al. |
| 2013/0169518 | A1 | 7/2013 | Wu et al. |
| 2016/0091775 | A1 | 3/2016 | Gibson et al. |
| 2017/0307800 | A1* | 10/2017 | Fattal .................. G02B 6/0038 |
| 2017/0363794 | A1 | 12/2017 | Wan et al. |
| 2018/0011237 | A1 | 1/2018 | Fattal |
| 2018/0024287 | A1 | 1/2018 | Shim et al. |
| 2018/0052501 | A1 | 2/2018 | Jones, Jr. et al. |
| 2018/0129060 | A1 | 5/2018 | Lee et al. |
| 2018/0172893 | A1 | 6/2018 | Fattal et al. |
| 2018/0210146 | A1 | 7/2018 | Klug et al. |
| 2019/0011625 | A1 | 1/2019 | Wang et al. |
| 2019/0011635 | A1 | 1/2019 | Lai et al. |
| 2019/0227382 | A1 | 7/2019 | Watanabe et al. |
| 2020/0218011 | A1 | 7/2020 | Li et al. |
| 2021/0086407 | A1 | 3/2021 | Peng et al. |
| 2021/0240005 | A1 | 8/2021 | Fattal et al. |
| 2022/0050377 | A1 | 2/2022 | Hoekman et al. |

FOREIGN PATENT DOCUMENTS

| | | | |
|---|---|---|---|
| CN | 108027532 | | 5/2018 |
| CN | 113748373 | | 3/2024 |
| EP | 3963390 | | 3/2022 |
| HK | 40062455 | | 6/2022 |
| JP | 2010033772 | | 2/2010 |
| JP | 2018503230 | | 2/2018 |
| JP | 2018509645 | | 4/2018 |
| JP | 2022531173 | | 7/2022 |
| JP | 7227403 | | 2/2023 |
| KR | 20040075430 | | 8/2004 |
| KR | 20050065416 | | 6/2005 |
| KR | 20110028595 | | 3/2011 |
| KR | 20150046513 | A | 4/2015 |
| KR | 20170092035 | | 8/2017 |
| KR | 20170103755 | | 9/2017 |
| KR | 20170125937 | | 11/2017 |
| KR | 20190025554 | A | 3/2019 |
| KR | 20210138804 | | 11/2021 |
| TW | I510820 | | 12/2015 |
| TW | 202105754 | | 2/2021 |
| TW | I744878 | | 11/2021 |
| WO | 2012038856 | A1 | 3/2012 |
| WO | 2016111707 | | 7/2016 |
| WO | WO-2017164871 | A1 * | 9/2017 ........... G02B 27/225 |
| WO | 2019066873 | A1 | 4/2019 |
| WO | 2020206151 | A1 | 10/2020 |
| WO | 2020223134 | | 11/2020 |
| WO | 2020223135 | A1 | 11/2020 |

OTHER PUBLICATIONS

Fattal, David et al., "A multi-directional backlight for a wide-angle, glasses-free three-dimensional display," Nature, Mar. 21, 2013, pp. 348-351, vol. 495, Macmillan Publishers Limited, 2013.

Kee, Edwin., "Hitachi Full Parallax 3D Display Offers Mind Bending Visuals," http://www.ubergizmo.com/2011/10/hitachi-full-parallax-3d-display-offers-mind-bending-visuals, Oct. 4, 2011, 2 pages.

Reichelt et al., "Holographic 3-D Displays—Electro-holography within the Grasp of Commercialization," Advances in Lasers and Electro-Optics, Optics, Nelson Costa and Adolfo Cartaxo (Ed.), (2010), pp. 683-711, ISBN: 978-953-307-088-9, InTech, Available from: http://www.intechopen.com/books/advances-in-lasers-and-electro-optics/holographic-3-ddisplays-electro-holography-within-the-grasp-of-commercialization.

Travis et al., "Collimated light from a waveguide for a display backlight," Optics Express, Oct. 2009, pp. 19714-19719, vol. 17, No. 22.

Xu et al., "Computer-Generated Holography for Dynamic Display of 3D Objects with Full Parallax," International Journal of Virtual Reality, 2009, pp. 33-38, vol. 8, No. 2.

Son, Jung-Young et al., "Three-Dimensional Imaging Methods Based on Multiview Images," IEEE/OSA Journal of Display Technology, Sep. 2005, pp. 125-140, vol. 1, No. 1.

International Search Report and Written Opinion (ISRWO) by International Searching Authority (ISA) Korean Intellectual Property Office (KIPO) dated Aug. 14, 2020 (10 pages) for foreign counterpart parent International Application No. PCT/US2020/029986.

"International Application Serial No. PCT US2020 029986, International Search Report mailed Aug. 14, 2020", 3 pgs.

"International Application Serial No. PCT US2020 029986, Written Opinion mailed Aug. 14, 2020", 5 pgs.

"International Application Serial No. PCT US2020 029986, International Preliminary Report on Patentability mailed Nov. 11, 2021", 7 pgs.

"Korean Application Serial No. 10-2021-7036899, Notice of Preliminary Rejection mailed Apr. 1, 2024", w English Translation, 12 pgs.

"International Application Serial No. PCT US2020 029987, International Search Report mailed Aug. 11, 2020", 4 pgs.

"International Application Serial No. PCT US2020 029987, Written Opinion mailed Aug. 11, 2020", 4 pgs.

"International Application Serial No. PCT US2020 029987, International Preliminary Report on Patentability mailed Nov. 11, 2021", 6 pgs.

"European Application Serial No. 20798945.0, Response to Communication pursuant to Rules 161(2) and 162 EPC filed Jun. 8, 2022", 18 pgs.

"European Application Serial No. 20798945.0, Extended European Search Report mailed Jan. 2, 2023", 4 pgs.

"European Application Serial No. 20798945.0, Response filed Jun. 13, 2023 to Extended European Search Report mailed Jan. 2, 2023", 1 pg.

(56) References Cited

OTHER PUBLICATIONS

"European Application Serial No. 20798945.0, Intention to Grant mailed Aug. 2, 2023", 61 pgs.
"Canadian Application Serial No. 3,136,673, Voluntary Amendment filed Oct. 8, 2021", 25 pgs.
"Chinese Application Serial No. 202080032100.6, Office Action mailed Jun. 5, 2023", W English Translation, 9 pgs.
"European Application Serial No. 20799116.7, Extended European Search Report mailed May 12, 2023", 11 pgs.

\* cited by examiner

METHOD OF FABRICATING DIFFRACTIVE BACKLIGHT

CROSS-REFERENCE TO RELATED APPLICATIONS

This application is a continuation patent application of and claims priority to International Patent Application No. PCT/US2020/029986, filed Apr. 25, 2020, which claims the benefit of priority to U.S. Provisional Patent Application Ser. No. 62/839,736, filed Apr. 28, 2019, the entire contents of both of which are herein incorporated by reference.

STATEMENT REGARDING FEDERALLY SPONSORED RESEARCH OR DEVELOPMENT

N/A

BACKGROUND

Electronic displays are a nearly ubiquitous medium for communicating information to users of a wide variety of devices and products. Among the most commonly found electronic displays are the cathode ray tube (CRT), plasma display panels (PDP), liquid crystal displays (LCD), electroluminescent displays (EL), organic light emitting diode (OLED) and active matrix OLEDs (AMOLED) displays, electrophoretic displays (EP) and various displays that employ electromechanical or electrofluidic light modulation (e.g., digital micromirror devices, electrowetting displays, etc.). In general, electronic displays may be categorized as either active displays (i.e., displays that emit light) or passive displays (i.e., displays that modulate light provided by another source). Among the most obvious examples of active displays are CRTs, PDPs and OLEDs/AMOLEDs. Displays that are typically classified as passive when considering emitted light are LCDs and EP displays. Passive displays, while often exhibiting attractive performance characteristics including, but not limited to, inherently low power consumption, may find somewhat limited use in many practical applications given the lack of an ability to emit light.

To overcome the limitations of passive displays associated with emitted light, many passive displays are coupled to an external source of light. The coupled source of light may allow these otherwise passive displays to emit light and function substantially as an active display. Examples of such coupled sources of light are backlights. Backlights are sources of light (often panels) that are placed behind an otherwise passive display to illuminate the passive display. For example, a backlight may be coupled to an LCD or an EP display. The backlight emits light that passes through the LCD or the EP display. The light emitted is modulated by the LCD or the EP display and the modulated light is then emitted, in turn, from the LCD or the EP display.

BRIEF DESCRIPTION OF THE DRAWINGS

Various features of examples and embodiments in accordance with the principles described herein may be more readily understood with reference to the following detailed description taken in conjunction with the accompanying drawings, where like reference numerals designate like structural elements, and in which.

Certain examples and embodiments have other features that are one of in addition to and in lieu of the features illustrated in the above-referenced figures. These and other features are detailed below with reference to the above-referenced figures.

DETAILED DESCRIPTION

Examples and embodiments in accordance with the principles described herein methods of fabricating diffractive backlights with application to electronic displays of various types. In particular, various method of fabricating diffractive backlights according to the principles described herein employ a universal grating, a portion of which is selected by a reflective island to define a grating element. The selection of the portion of the universal grating to define the grating element using the reflective island may provide self-alignment of the reflective island and grating element, which together provide a reflective diffraction grating element of the diffractive backlight. In addition to self-alignment of the grating element and reflective island, the methods of diffractive backlight fabrication described herein may also be tolerant to translation and stretch between reflective diffraction grating elements across an extent of the diffractive backlight as well as may facilitate fabrication of large-area diffractive backlights for electronic display applications, according to various embodiments. Electronic displays that may employ diffractive backlights fabricated according to the methods described herein may include, but are not limited to, multiview displays and other similar displays, e.g., autostereoscopic or 'glasses-free' three-dimensional (3D) displays.

Herein a 'two-dimensional display' or '2D display' is defined as a display configured to provide a view of an image that is substantially the same regardless of a direction from which the image is viewed (i.e., within a predefined viewing angle or range of the 2D display). A conventional liquid crystal display (LCD) found in many smart phones and computer monitors are examples of 2D displays. In contrast herein, a 'multiview display' is defined as an electronic display or display system configured to provide different views of a multiview image in or from different view directions. In particular, the different views may represent different perspective views of a scene or object of the multiview image. Uses of unilateral backlighting and unilateral multiview displays described herein include, but are not limited to, mobile telephones (e.g., smart phones), watches, tablet computers, mobile computers (e.g., laptop computers), personal computers and computer monitors, automobile display consoles, cameras displays, and various other mobile as well as substantially non-mobile display applications and devices.

Figure 1A:
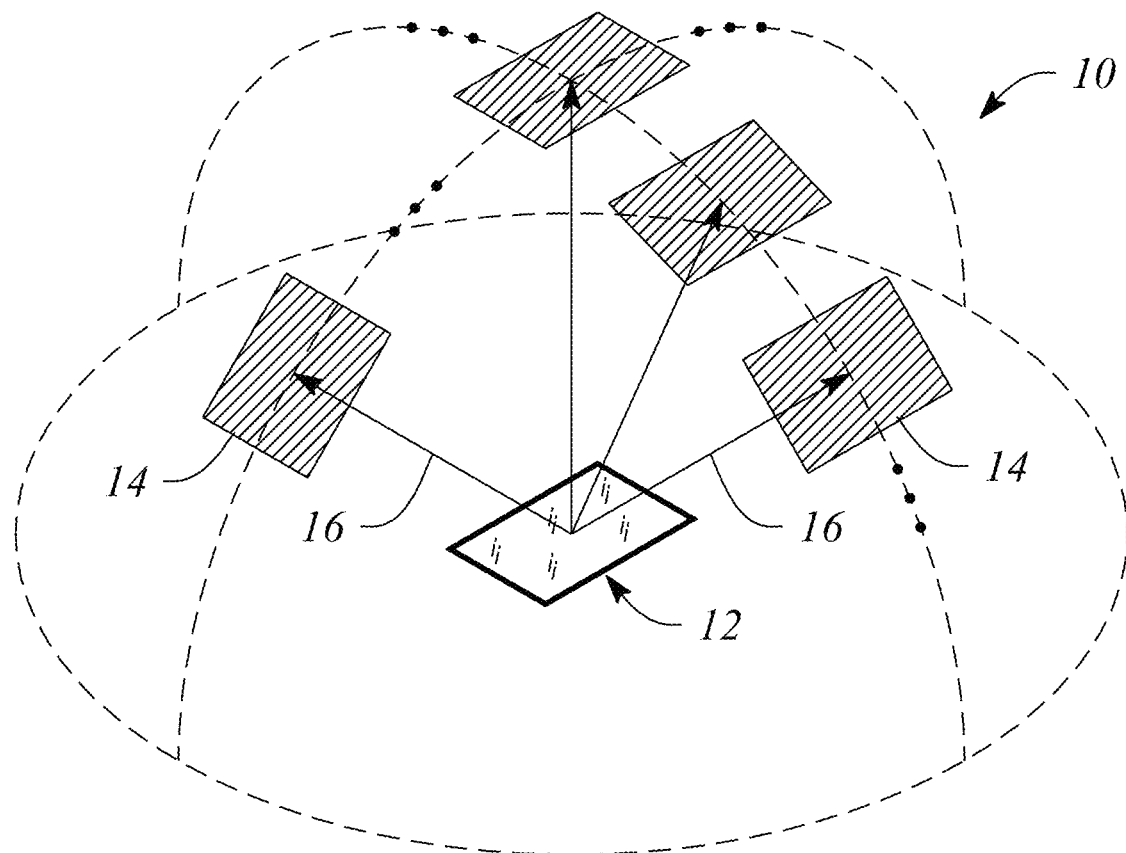
FIG. 1A illustrates a perspective view of a multiview display in an example, according to an embodiment consistent with the principles described herein.

FIG. 1A illustrates a perspective view of a multiview display 10 in an example, according to an embodiment consistent with the principles described herein. As illustrated in FIG. 1A, the multiview display 10 comprises a screen 12 to display a multiview image to be viewed. The screen 12 may be a display screen of a telephone (e.g., mobile telephone, smart phone, etc.), a tablet computer, a laptop computer, a computer monitor of a desktop computer, a camera display, or an electronic display of substantially any other device, for example.

The multiview display 10 provides different views 14 of the multiview image in different view directions 16 relative to the screen 12. The view directions 16 are illustrated as arrows extending from the screen 12 in various different principal angular directions; the different views 14 are illustrated as shaded polygonal boxes at the termination of the arrows (i.e., depicting the view directions 16); and only four views 14 and four view directions 16 are illustrated, all by way of example and not limitation. Note that while the different views 14 are illustrated in FIG. 1A as being above the screen, the views 14 actually appear on or in a vicinity of the screen 12 when the multiview image is displayed on the multiview display 10. Depicting the views 14 above the screen 12 is only for simplicity of illustration and is meant to represent viewing the multiview display 10 from a respective one of the view directions 16 corresponding to a particular view 14. A 2D display may be substantially similar to the multiview display 10, except that the 2D Display is generally configured to provide a single view (e.g., one view similar to view 14) of a displayed image as opposed to the different views 14 of the multiview image provided by the multiview display 10.

A view direction or equivalently a light beam having a direction corresponding to a view direction of a multiview display generally has a principal angular direction given by angular components $\{\theta, \phi\}$, by definition herein. The angular component $\theta$ is referred to herein as the 'elevation component' or 'elevation angle' of the light beam. The angular component $\phi$ is referred to as the 'azimuth component' or 'azimuth angle' of the light beam. By definition, the elevation angle $\theta$ is an angle in a vertical plane (e.g., perpendicular to a plane of the multiview display screen while the azimuth angle $\phi$ is an angle in a horizontal plane (e.g., parallel to the multiview display screen plane).

Figure 1B:
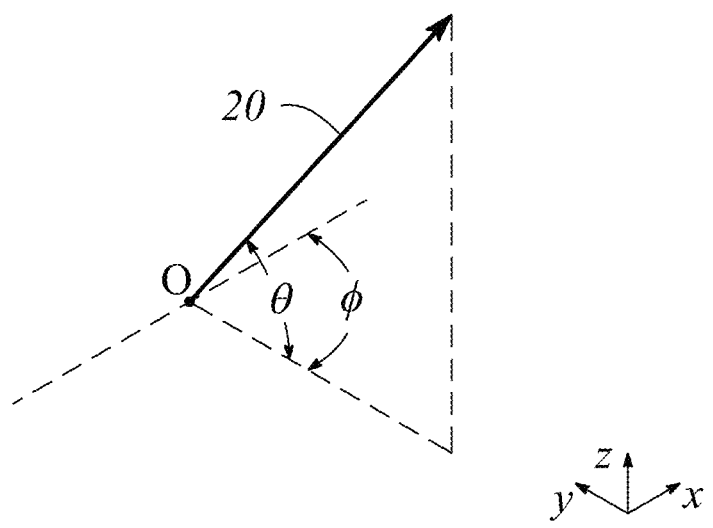
FIG. 1B illustrates a graphical representation of the angular components of a light beam having a particular principal angular direction corresponding to a view direction of a multiview display in an example, according to an embodiment consistent with the principles described herein.

FIG. 1B illustrates a graphical representation of the angular components $\{\theta, \phi\}$ of a light beam 20 having a particular principal angular direction corresponding to a view direction (e.g., view direction 16 in FIG. 1A) of a multiview display in an example, according to an embodiment consistent with the principles described herein. In addition, the light beam 20 is emitted or emanates from a particular point, by definition herein. That is, by definition, the light beam 20 has a central ray associated with a particular point of origin within the multiview display. FIG. 1B also illustrates the light beam (or view direction) point of origin O.

Herein, a 'light guide' is defined as a structure that guides light within the structure using total internal reflection. In particular, the light guide may include a core that is substantially transparent at an operational wavelength of the light guide. The term 'light guide' generally refers to a dielectric optical waveguide that employs total internal reflection to guide light at an interface between a dielectric material of the light guide and a material or medium that surrounds that light guide. By definition, a condition for total internal reflection is that a refractive index of the light guide is greater than a refractive index of a surrounding medium adjacent to a surface of the light guide material. In some embodiments, the light guide may include a coating in addition to or instead of the aforementioned refractive index difference to further facilitate the total internal reflection. The coating may be a reflective coating, for example. The light guide may be any of several light guides including, but not limited to, one or both of a plate or slab guide and a strip guide.

According to various embodiments, the light guide itself may comprise an optically transparent material configured to guide light by total internal reflection. Any of a variety of optically transparent materials may be employed in the light guide including, but not limited to, one or more of various types of glass (e.g., silica glass, alkali-aluminosilicate glass, borosilicate glass, etc.) and substantially optically transparent plastics or polymers (e.g., poly(methyl methacrylate) or 'acrylic glass', polycarbonate, etc.).

Further herein, the term 'plate' when applied to a light guide as in a 'plate light guide' is defined as a piecewise or differentially planar layer or sheet, which is sometimes referred to as a 'slab' guide. In particular, a plate light guide is defined as a light guide configured to guide light in two substantially orthogonal directions bounded by a top surface and a bottom surface (i.e., opposite surfaces) of the light guide. Further, by definition herein, the top and bottom surfaces are both separated from one another and may be substantially parallel to one another in at least a differential sense. That is, within any differentially small section of the plate light guide, the top and bottom surfaces are substantially parallel or co-planar.

In some embodiments, the plate light guide may be substantially flat (i.e., confined to a plane) and therefore, the plate light guide is a planar light guide. In other embodiments, the plate light guide may be curved in one or two orthogonal dimensions. For example, the plate light guide may be curved in a single dimension to form a cylindrical shaped plate light guide. However, any curvature has a radius of curvature sufficiently large to insure that total internal reflection is maintained within the plate light guide to guide light. By definition herein, a 'light guide substrate' is a substrate that comprises a light guide, e.g., a plate light guide.

Herein, a 'diffraction grating' is generally defined as a plurality of features (i.e., diffractive features) arranged to provide diffraction of light incident on the diffraction grating. In some examples, the plurality of features may be arranged in a periodic or quasi-periodic manner. For example, the diffraction grating may include a plurality of features (e.g., a plurality of grooves or ridges in a material surface) arranged in a one-dimensional (1D) array. In other examples, the diffraction grating may be a two-dimensional (2D) array of features. The diffraction grating may be a 2D array of bumps on or holes in a material surface, for example.

As such, and by definition herein, the 'diffraction grating' is a structure that provides diffraction of light incident on the diffraction grating. If the light is incident on the diffraction grating from a light guide, the provided diffraction or diffractive scattering may result in, and thus be referred to as, 'diffractive coupling' in that the diffraction grating may couple light out of the light guide by diffraction. The diffraction grating also redirects or changes an angle of the light by diffraction (i.e., at a diffractive angle). In particular, as a result of diffraction, light leaving the diffraction grating generally has a different propagation direction than a propagation direction of the light incident on the diffraction grating (i.e., incident light). The change in the propagation direction of the light by diffraction is referred to as 'diffractive redirection' herein. Hence, the diffraction grating may be understood to be a structure including diffractive features that diffractively redirects light incident on the diffraction grating and, if the light is incident from a light guide, the diffraction grating may also diffractively couple out the light from the light guide.

Further, by definition herein, the features of a diffraction grating are referred to as 'diffractive features' and may be one or more of at, in and on a material surface (i.e., a boundary between two materials). The surface may be a surface of a light guide, for example. The diffractive features may include any of a variety of structures that diffract light including, but not limited to, one or more of grooves, ridges, holes and bumps at, in or on the surface. For example, the diffraction grating may include a plurality of substantially parallel grooves in the material surface. In another example, the diffraction grating may include a plurality of parallel ridges rising out of the material surface. The diffractive features (e.g., grooves, ridges, holes, bumps, etc.) may have any of a variety of cross sectional shapes or profiles that provide diffraction including, but not limited to, one or more of a sinusoidal profile, a rectangular profile (e.g., a binary diffraction grating), a triangular profile and a saw tooth profile (e.g., a blazed grating).

According to various examples described herein, a diffraction grating (e.g., a diffraction grating of a multibeam element, as described below) may be employed to diffractively scatter or couple light out of a light guide (e.g., a plate light guide) as a light beam. In particular, a diffraction angle $\theta_m$ of or provided by a locally periodic diffraction grating may be given by equation (1) as:

$$\theta_m = \sin^{-1}\left(n\sin\theta_i - \frac{m\lambda}{d}\right) \quad (1)$$

where $\lambda$ is a wavelength of the light, m is a diffraction order, n is an index of refraction of a light guide, d is a distance or spacing between features of the diffraction grating, $\theta_i$ is an angle of incidence of light on the diffraction grating. For simplicity, equation (1) assumes that the diffraction grating is adjacent to a surface of the light guide and a refractive index of a material outside of the light guide is equal to one (i.e., $n_{out}=1$). In general, the diffraction order m is given by an integer. A diffraction angle $\theta_m$ of a light beam produced by the diffraction grating may be given by equation (1) where the diffraction order is positive (e.g., m>0). For example, first-order diffraction is provided when the diffraction order m is equal to one (i.e., m=1).

Figure 2:
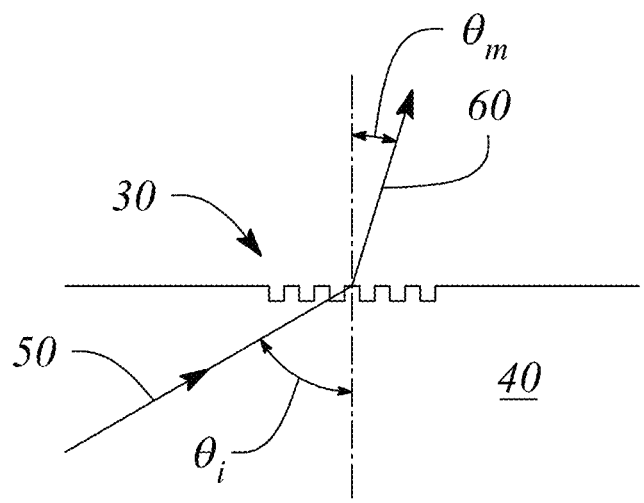
FIG. 2 illustrates a cross sectional view of a diffraction grating in an example, according to an embodiment consistent with the principles described herein.

FIG. 2 illustrates a cross sectional view of a diffraction grating 30 in an example, according to an embodiment consistent with the principles described herein. For example, the diffraction grating 30 may be located on a surface of a light guide 40. In addition, FIG. 2 illustrates a light beam 50 incident on the diffraction grating 30 at an incident angle $\theta_i$. The light beam 50 is a guided light beam within the light guide 40. Also illustrated in FIG. 2 is a directional light beam 60 diffractively produced and coupled-out by the diffraction grating 30 as a result of diffraction of the incident light beam 50. The directional light beam 60 has a diffraction angle (or 'principal angular direction' herein) as given by equation (1). The diffraction angle may correspond to a diffraction order 'm' of the diffraction grating 30, for example.

By definition herein, a 'universal grating' or equivalently a 'universal diffraction grating' is defined as a diffraction grating that substantially covers or has an extent comparable to an extent of a substrate, e.g., a light guide substrate. For example, the universal grating may have a length that is about equal to a length of the light guide substrate and also may have a width that is about equal to a width of the substrate, by definition. In some embodiments, an extent of the universal grating may exclude a border region or strip along one or more edges of the substrate. In other embodiments, the 'universal grating' may be defined as a diffraction grating that merely extends beyond, and in some embodiments well beyond, a boundary of a grating element formed from or using the universal grating, as detailed below. In some embodiments, the universal diffraction grating may be or comprise a sub-wavelength diffraction grating having one or both of a diffractive feature size and a diffractive feature spacing that is less than a wavelength $\lambda$ is a wavelength of the light that is diffracted by the diffraction grating.

In some embodiments, the universal grating may be a uniform diffraction grating or having a uniform or substantially uniform spacing of diffractive features (i.e., the grating pitch) across an extent of the universal grating. For example, the uniform diffraction grating may comprise a plurality of diffractive features, each diffractive feature of the diffractive feature plurality being of a similar size to and having a similar spacing from an adjacent diffractive feature.

In other embodiments, the universal grating may comprise a plurality of subgratings. Different subgratings of the subgrating plurality may have different characteristics from each other, in some embodiments. For example, subgratings may comprising one or both of a different diffractive feature spacing and a different diffractive feature orientation from other subgratings of the subgrating plurality. In some embodiments, the diffractive features of the subgratings may be curved, e.g., the diffractive features may comprise one or both of curved grooves or ridges.

In some embodiments, the subgratings of the subgrating plurality may be arranged in an array. The array may be either a one-dimensional (1D) array or a two-dimensional (2D) array, according to various embodiments. Further, the universal grating may comprise a plurality of subgrating arrays that repeat across the extent of the universal grating, in some embodiments. In other embodiments, the different subgratings of the subgrating plurality may be distributed substantially randomly across the extent of the universal grating.

In yet other embodiments, the universal grating may comprise a chirped diffraction grating or even an array of chirped diffraction gratings. By definition, the 'chirped' diffraction grating is a diffraction grating exhibiting or having a diffraction spacing of the diffractive features that varies across an extent or length of the chirped diffraction grating. In some embodiments, the chirped diffraction grating may have or exhibit a chirp of the diffractive feature spacing that varies linearly with distance. As such, the chirped diffraction grating is a 'linearly chirped' diffraction grating, by definition. In other embodiments, the chirped diffraction grating may exhibit a non-linear chirp of the diffractive feature spacing. Various non-linear chirps may be used including, but not limited to, an exponential chirp, a logarithmic chirp or a chirp that varies in another, substantially non-uniform or random but still monotonic manner. Non-monotonic chirps such as, but not limited to, a sinusoidal chirp or a triangle or sawtooth chirp, may also be employed. In some embodiments, subgratings of the universal grating may comprise a chirped diffraction grating.

Herein a 'collimator' is defined as substantially any optical device or apparatus that is configured to collimate light. According to various embodiments, an amount of collimation provided by the collimator may vary in a predetermined degree or amount from one embodiment to another. Further, the collimator may be configured to provide collimation in one or both of two orthogonal directions (e.g., a vertical direction and a horizontal direction). That is, the collimator may include a shape in one or both of two orthogonal directions that provides light collimation, according to some embodiments.

Herein, a 'collimation factor' is defined as a degree to which light is collimated. In particular, a collimation factor defines an angular spread of light rays within a collimated beam of light, by definition herein. For example, a collimation factor $\sigma$ may specify that a majority of light rays in a beam of collimated light is within a particular angular spread (e.g., $+/-\sigma$ degrees about a central or principal angular direction of the collimated light beam). The light rays of the collimated light beam may have a Gaussian distribution in terms of angle and the angular spread may be an angle determined by at one-half of a peak intensity of the collimated light beam, according to some examples.

Herein, a 'light source' is defined as a source of light (e.g., an optical emitter configured to produce and emit light). For example, the light source may comprise an optical emitter such as a light emitting diode (LED) that emits light when activated or turned on. In particular, herein the light source may be substantially any source of light or comprise substantially any optical emitter including, but not limited to, one or more of a light emitting diode (LED), a laser, an organic light emitting diode (OLED), a polymer light emitting diode, a plasma-based optical emitter, a fluorescent lamp, an incandescent lamp, and virtually any other source of light. The light produced by the light source may have a color (i.e., may include a particular wavelength of light), or may be a range of wavelengths (e.g., white light). In some embodiments, the light source may comprise a plurality of optical emitters. For example, the light source may include a set or group of optical emitters in which at least one of the optical emitters produces light having a color, or equivalently a wavelength, that differs from a color or wavelength of light produced by at least one other optical emitter of the set or group. The different colors may include primary colors (e.g., red, green, blue) for example.

Herein, 'nanoimprint lithography' is defined as using a mold or patterning tool to transfer a pattern to an imprintable surface of a substrate through or using an imprinting process, where features represented in the mold or patterning tool comprise a nanoscale size or a nanoscale tolerance. In some examples, the imprintable surface may comprise a material of the substrate itself that is relatively softer than the mold. In another example, the imprintable surface may comprise a layer of a relatively softer material deposited on or applied over a surface the substrate. In either case, the relatively softer material of the imprintable surface is configured to receive and retain the imprinted pattern after the mold is removed and during further processing. A surface of the softer material that receives the mold during imprinting is referred to herein as the 'receiving layer' or 'receiving surface.'

In some embodiments, the relatively softer material may be cured or hardened during imprinting to facilitate retention of the imprinted pattern. Curing essentially 'freezes' or fixes the receiving layer in a shape or pattern determined by the mold. For example, a layer of a photo-curable material such as, but not limited to, a photo-activated monomer, oligomer, or polymer, (e.g., photoresist) that hardens when exposed to light (e.g., infrared, visible or ultraviolet (UV) illumination) may be used as the receiving layer. Prior to curing, the photo-curable material is soft (e.g., liquid or semi-liquid) and readily accepts the mold imprint pattern. Upon exposure to light, the photo-curable material cures around the mold. The cured photo-curable material of the receiving layer thus retains the imprint pattern of the mold.

In another example, a thermoplastic material applied as a layer or film to a surface of the substrate may be used as the receiving layer. Prior to imprinting, the thermoplastic material layer is heated to about a glass transition temperature of the material, thereby softening the material. The mold is pressed into the softened material and the material is cooled to below the glass transition temperature causing the material to harden or cure around the impressed mold. The imprinted pattern is retained by the cured thermoplastic material. Examples of thermoplastic polymers that are used as the receiving layer include, but are not limited to, polycarbonate, poly(methyl methacrylate) (PMMA) and methyl methacrylate (MMA).

In some embodiments, the imprinted pattern formed in the soft material layer may be then further 'transferred' into the substrate as a positive image of the mold through lithography and etching, for example. The transferred pattern is further processed to form the features in the substrate. Such features are typically nanometer-scale in size. The features may be transferred using a dry etching technique such as, but not limited to, reactive ion etching (ME) and plasma etching or a wet chemical etching technique to selectively remove the substrate material and form the features. The molded receiving layer may also be etched or even removed using one or both of the dry and wet etching techniques, according to some embodiments.

Further, as used herein, the article 'a' is intended to have its ordinary meaning in the patent arts, namely 'one or more'. For example, 'a reflective island' means one or more reflective islands and as such, 'the reflective island' means 'reflective island(s)' herein. Also, any reference herein to 'top', 'bottom', 'upper', 'lower', 'up', 'down', 'front', back', 'first', 'second', 'left' or 'right' is not intended to be a limitation herein. Herein, the term 'about' when applied to a value generally means within the tolerance range of the equipment used to produce the value, or may mean plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples herein are intended to be illustrative only and are presented for discussion purposes and not by way of limitation.

Figure 3:
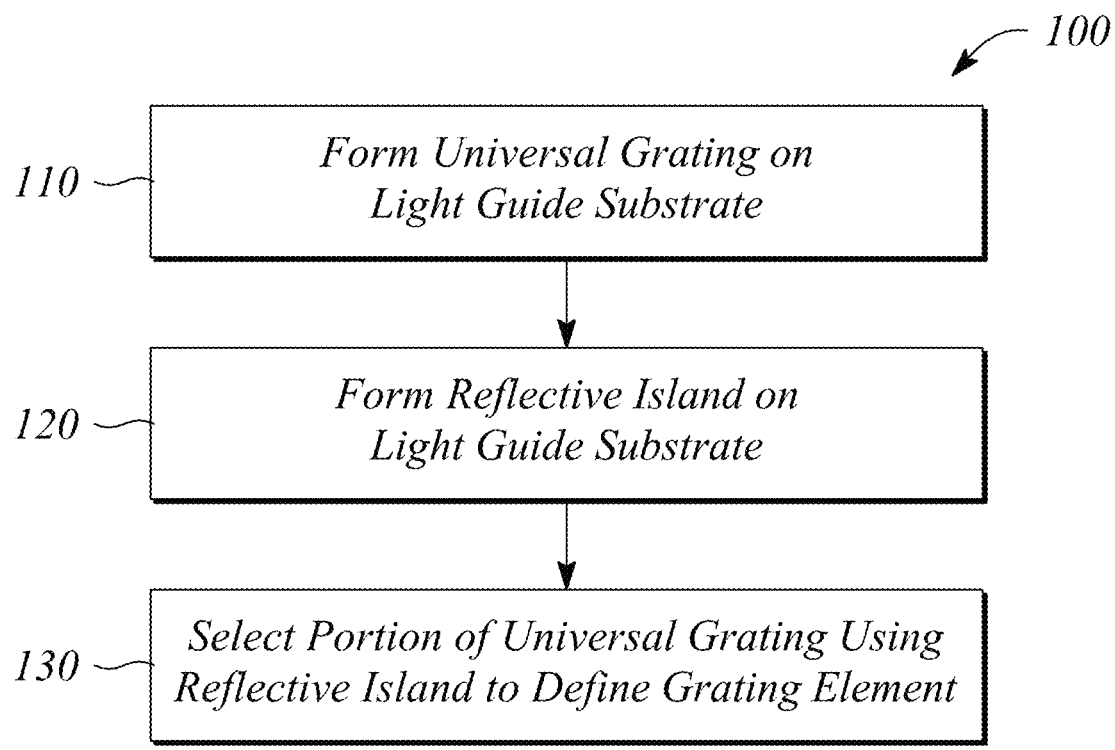
FIG. 3 illustrates flow chart of a method of fabricating a diffractive backlight in an example, according to an embodiment consistent with the principles described herein.

According to some embodiments of the principles described herein, a method of fabricating a diffractive backlight is provided. FIG. 3 illustrates flow chart of a method 100 of fabricating a diffractive backlight in an example, according to an embodiment consistent with the principles described herein. As illustrated, the method 100 of fabricating a diffractive backlight comprises forming 110 a universal grating on a light guide substrate. In some embodiments, forming 110 a universal grating may provide the universal grating on or adjacent to a surface of the light guide substrate. In other embodiments, the universal grating may be provided on surface of a layer of optical material that is, in turn, on a surface of the light guide substrate.

According to various embodiments, forming 110 a universal grating may employ any of a variety of different patterning methods including, but not limited to, photolithography, focused ion beam lithography, and electron beam lithography, and nanoimprint lithography (NIL). In particular, in some embodiments, forming 110 a universal grating on the light guide substrate may comprise nanoimprinting the universal grating nanoimprinting the universal grating in a nanoimprint receiving layer of the light guide substrate using a nanoimprint mold. In some embodiments, the nanoimprint receiving layer may comprise a material of the light guide substrate, e.g., a surface of the light guide substrate itself. In other embodiments, the nanoimprint receiving layer may comprise a layer or material deposited or provided on the surface of the light guide substrate. For example, the layer may be a layer of optical material that is formable according to nanoimprint lithography having an index of refraction that is matched to an index of refraction of the light guide substrate, e.g., a layer of poly(methyl methacrylate) (PMMA) on a surface of a glass or PMMA light guide substrate.

The method 100 of fabricating a diffractive backlight illustrated in FIG. 3 further comprises forming 120 a reflective island on the light guide substrate. According to some embodiments, forming 120 the reflective island comprises patterning a layer of reflective material to define the reflective island. The layer of reflective material may comprise one or more of a metal, a metal polymer (e.g., polymer aluminum), and a high-index dielectric, according to various embodiments. For example, the layer of reflective material may be deposited by or using one or more of evaporative deposition, sputter deposition, or an equivalent. Then the reflective material layer may be patterned using photolithography or imprint lithography, for example. In another example, the reflective island may be formed 120 comprising ink stamping, screen printing, or a similar printing process. In yet another example, forming 120 the reflective island may employ preform deposition in which a reflective island preform is employed.

In some embodiments, the universal grating is located on a surface of the light guide substrate and the reflective island is formed 120 over the universal grating. As such, forming 110 the universal grating is performed before forming 120 the reflective island. In particular, in some embodiments, forming 120 the reflective island comprises depositing the layer of reflective material over the universal grating, and then etching the reflective material layer using a patterned photoresist to remove a portion of the reflective material layer and define the reflective island.

In other embodiments, forming 120 the reflective island is performed before forming 110 the universal grating. For example, the reflective island may be formed 120 on a surface of the light guide substrate and then the universal grating may be formed 110 in a receiving layer that is applied over the reflective island. As a result, the reflective island may be located on a surface of the light guide substrate and the universal grating is then formed 110 over the reflective island.

As illustrated in FIG. 3, the method 100 of fabricating a diffractive backlight further comprises selecting 130 a portion of the universal grating using the reflective island to define a grating element. The grating element that is defined by selecting 130 represents a diffraction grating that comprises a relatively small portion of the original universal grating. Further, the defined grating element has a size and a location on the light guide substrate that is determined by the reflective island. For example, the grating element may be substantially similar in size and also may be substantially collocated or aligned with the reflective island as a result of selecting 130 the universal grating portion. According to various embodiments, a reflective diffraction grating element of the diffractive backlight comprises a combination of the grating element and the reflective island.

In some embodiments, selecting 130 a portion of the universal grating using the reflective island to define a grating element comprises removing an exposed portion of the universal grating that is not covered by the reflective island by etching the exposed portion. In particular, selecting 130 may employ the reflective island as a photomask to photolithographically define the grating element.

For example, selecting 130 a portion of the universal grating may comprise applying a photoresist to cover the universal grating. The photoresist is then exposed using a collimated light source to illuminate the photoresist from a side of the light guide substrate that is opposite to a side on which the reflective island is located. According to various embodiments, the photoresist may be a positive photoresist and the reflective island serves as a photomask to define a portion of the photoresist that remains after the photoresist is developed. Selecting 130 the portion of the universal grating to define the grating element then further comprises removing an exposed portion of the universal grating not covered by the photoresist that remains. For example, removing the exposed portion of the universal grating may comprise etching the exposed portion to remove material of the universal grating not covered by the photoresist.

In other embodiments, selecting 130 may employ etching or a similar process to remove a portion or portions of the universal grating to define the grating element, the reflective island being employed as an etch mask. In yet other embodiments, selecting 130 the portion of the universal grating using the reflective island to define a grating element comprises covering the universal grating and reflective island with a layer of optical material, the optical material layer being index-matched to the universal grating.

In some embodiments (not illustrated in FIG. 3), the method 100 of fabricating a diffractive backlight further comprises applying a negative photoresist to cover reflective island and the grating element. Following application, the negative photoresist may be exposed using a collimated light source to illuminate the negative photoresist and define an opening in the photoresist above the grating element. Then, a reflective material may be deposited on the grating element through the opening in the photoresist. As a result, the reflective material may exclusively cover the grating element.

In some embodiments, a layer of optical material may be deposited on the light guide substrate such that the optical material layer embeds the grating element, the reflective island, and the reflective material covering the grating element. The exposed portion of the universal grating that is removed is the exposed portion that is covered by the optical material layer.

Figure 4:
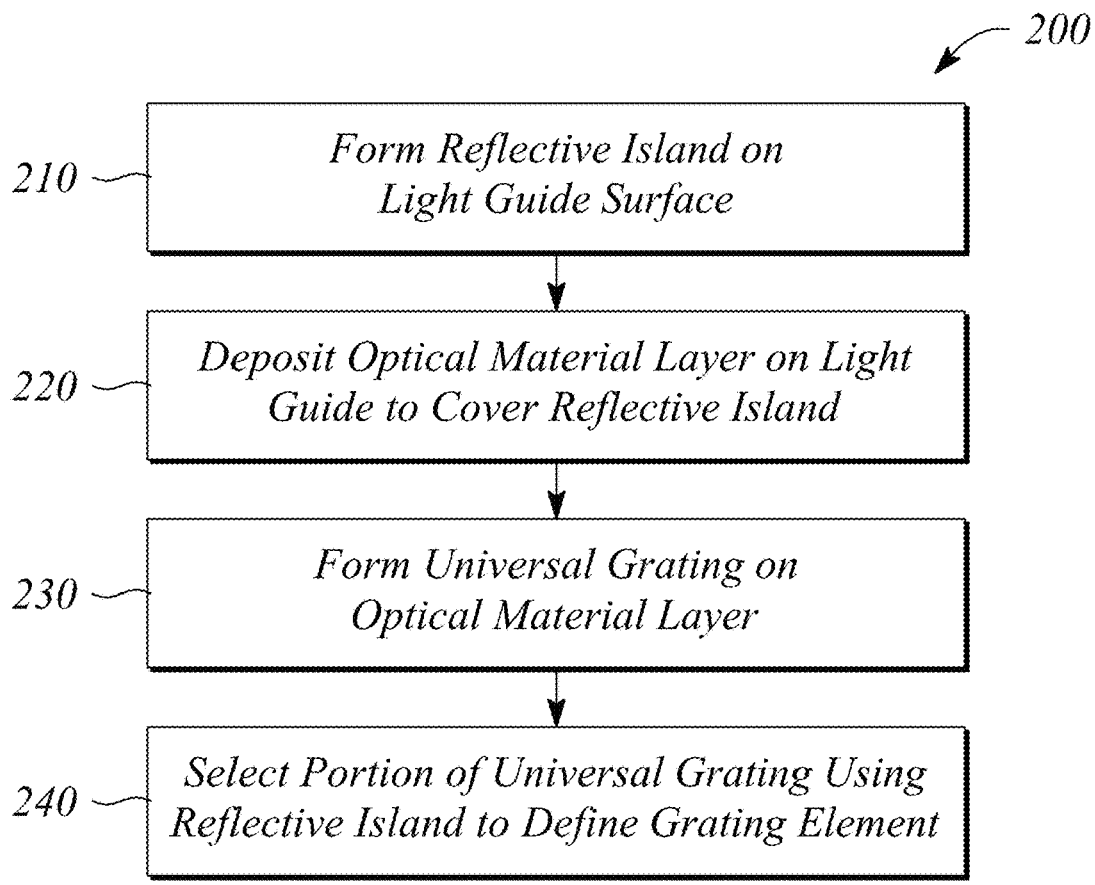
FIG. 4 illustrates flow chart of a method of fabricating a diffractive backlight in another example, according to an embodiment consistent with the principles described herein.

FIG. 4 illustrates flow chart of a method 200 of fabricating a diffractive backlight in another example, according to an embodiment consistent with the principles described herein. As illustrated in FIG. 4, the method 200 of fabricating a diffractive backlight comprises forming 210 a reflective island on a surface of a light guide. In various embodiments, the reflective island may comprise, but is not limited to, one or more of a metal, a metal polymer, and a high-index dielectric. In some embodiments, forming 210 a reflective island may be substantially similar to forming 120 a reflective island described above with respect to the method 100 of fabricating a diffractive backlight. For example, the reflective island may be formed 210 using photolithographic patterning of a deposited layer of reflective material. Further, the light guide may be substantially similar to the light guide substrate of the above-described method 100 of fabricating a diffractive backlight, in some embodiments.

As illustrated in FIG. 4, the method 200 of fabricating a diffractive backlight further comprises depositing 220 a layer of optical material on the light guide to cover the reflective island. In various embodiments, the optical material is index-matched to a material of the light guide. For example, the light guide may comprise glass or poly(methyl methacrylate) (PMMA) and the optical material may comprise PMMA, both having a refractive index of about 1.5.

The method 200 of fabricating a diffractive backlight illustrated in FIG. 4 further comprises forming 230 a universal grating on the optical material layer. In some embodiments, forming 230 a universal grating may be substantially similar to forming 110 a universal grating, as described above with respect to the method 100 of fabricating a diffractive backlight. For example, forming 230 a universal grating may use nanoimprint lithography, in some embodiments.

According to various embodiments, the method 200 of fabricating a diffractive backlight further comprises selecting 240 a portion of the universal grating using the reflective island to define a grating element. In various embodiments, a reflective diffraction grating element of the diffractive backlight comprises a combination of the grating element and the reflective island. In some embodiments, selecting 240 a portion of the universal grating may be substantially similar to selecting 130 a portion of the universal grating of the above-described method 100 of fabricating a diffractive backlight. For example, selecting 240 may comprise applying a photoresist to cover the universal grating and the exposing the photoresist using a collimated light source to illuminate the photoresist from a side of the light guide that is opposite to a side on which the reflective island is located, where the reflective island serves as a photomask. Further, selecting 240 a portion of the universal grating to define the grating element may comprise one of etching an exposed portion of the universal grating not covered by the photoresist that remains or covering the exposed portion of the universal grating with a layer of the optical material, for example.

Figure 5:
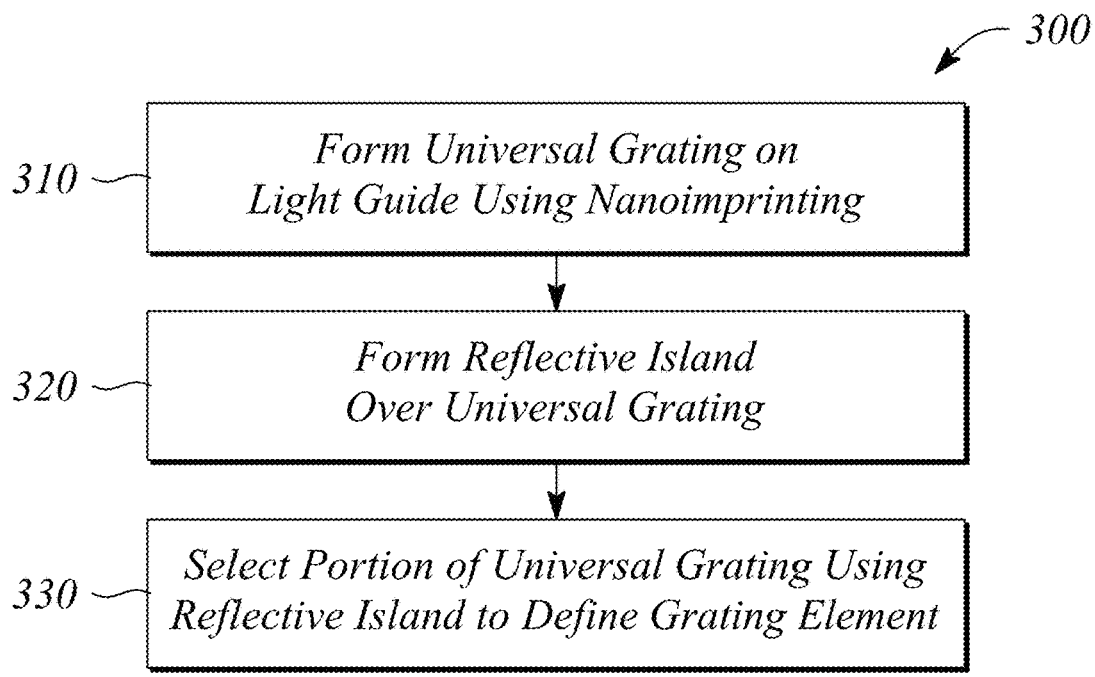
FIG. 5 illustrates flow chart of a method of fabricating a diffractive backlight in another example, according to an embodiment consistent with the principles described herein.

FIG. 5 illustrates flow chart of a method 300 of fabricating a diffractive backlight in another example, according to an embodiment consistent with the principles described herein. As illustrated in FIG. 5, the method 300 of fabricating a diffractive backlight comprises forming 310 a universal grating on a surface of a light guide by nanoimprinting the universal grating using a nanoimprint mold. In some embodiments, forming 310 a universal grating may be substantially similar to forming 110 a universal grating of the method 100 of fabricating a diffractive backlight, as described above.

The method 300 of fabricating a diffractive backlight illustrated in FIG. 5 further comprises forming 320 a reflective island over the universal grating and selecting 330 a portion of the universal grating using the reflective island to define a grating element. As described above, a reflective diffraction grating element of the diffractive backlight may comprise a combination of the grating element and the reflective island. In some embodiments, one or both of forming 320 a reflective island and selecting 330 a portion of the universal grating may be substantially similar to the above-described forming 120 a reflective island and forming 110 a universal grating, respectively. For example, forming 320 the reflective island over the universal grating may comprise patterning a layer of reflective material to define the reflective island, the layer of reflective material comprising one or more of a metal, a metal polymer, and a high-index dielectric.

In some embodiments, selecting 330 the portion of the universal grating using the reflective island to define a grating element comprises removing an exposed portion of the universal grating that is not covered by the reflective island by etching the exposed portion. In other embodiments, selecting 330 the portion of the universal grating comprises covering the universal grating and reflective island with a layer of optical material, the optical material layer being index-matched to the universal grating.

In some embodiments, the universal grating may comprise openings in the universal grating. The openings may be provided by photolithographic processing (e.g., etching of the universal grating), for example. In these embodiments, the method 300 may further comprise depositing a layer of reflective material in the openings to provide reflective islands that are not reflective diffraction grating elements.

EXAMPLES

Several examples of diffractive backlight fabrication according to one or more of above-described methods 100, 200, 300 are presented below. The examples illustrate results of employing the aforementioned methods, by way of example and not limitation.

Figure 6A:
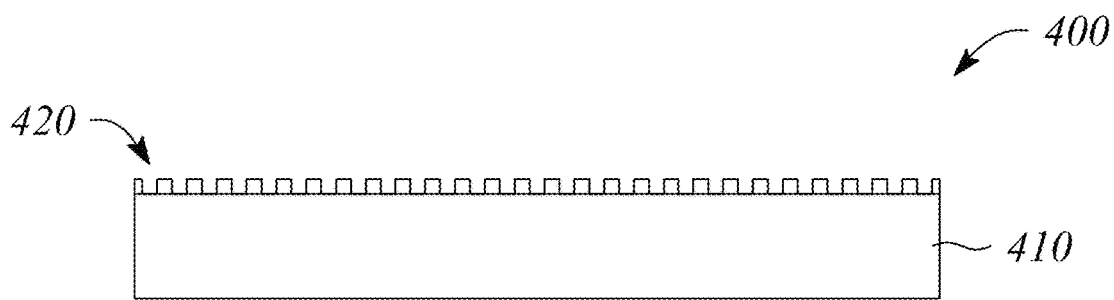
FIGS. 6A-6G illustrate cross sectional views of fabricating a diffractive backlight in an example, according to an embodiment of the principles described herein.
Figure 6B:
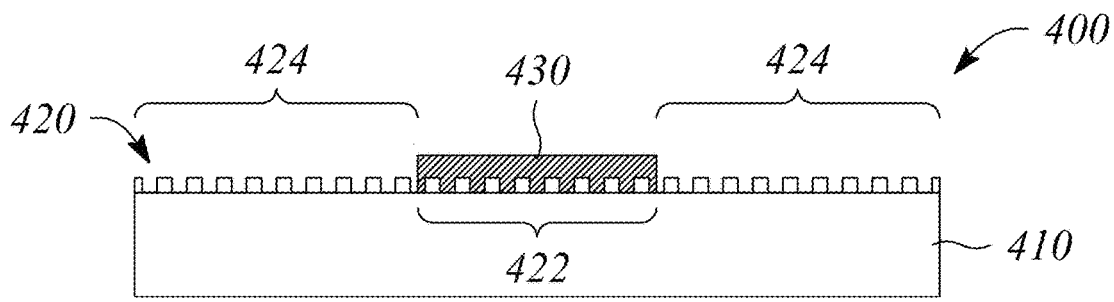
Figure 6C:
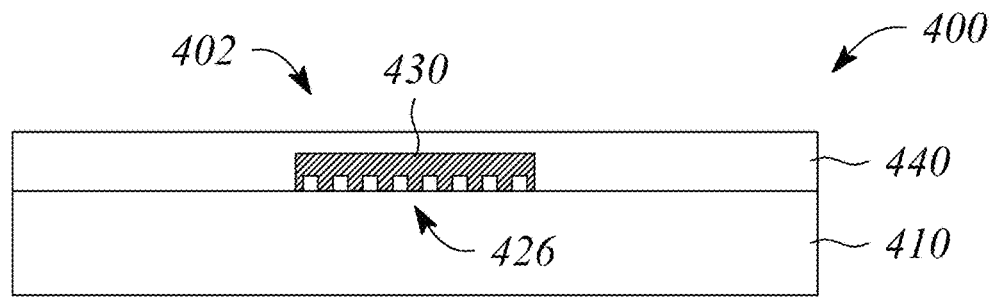

FIGS. 6A-6G illustrate cross sectional views of fabricating a diffractive backlight 400 in an example, according to an embodiment of the principles described herein. In particular, FIGS. 6A-6C illustrate the diffractive backlight 400 comprising a light guide substrate 410. In some embodiments, the light guide substrate 410 may substantially similar to either the light guide substrate or the light guide described above with respect to the method 100, 200, 300 of fabricating a diffractive backlight. In particular, a light guide of the diffractive backlight 400 may comprise the light guide substrate 410, according to various embodiments.

As illustrated in FIG. 6A, a universal grating 420 is provided on a surface of the light guide substrate 410. The universal grating 420 generally extends across an entire surface or substantially an entire surface of the light guide substrate 410. In some embodiments, the universal grating 420 may be substantially similar to the universal grating provided by forming 110 a universal grating that is described above with respect to the method 100, 300 of fabricating a diffractive backlight. For example, the universal grating 420 may be provided on the light guide substrate 410 using nanoimprint lithography.

FIG. 6B illustrates a reflective island 430 formed over and covering a portion 422 of the universal grating 420. Further, as illustrated in FIG. 6B, another portion 424 of the universal grating 420 is exposed and not covered by the universal grating 420. According to some embodiments, the reflective island 430 may be substantially similar to the reflective island described above as being provided by forming 120, 320 a reflective island of the above-described method 100, 300 of fabricating a diffractive backlight.

Figure 6D:
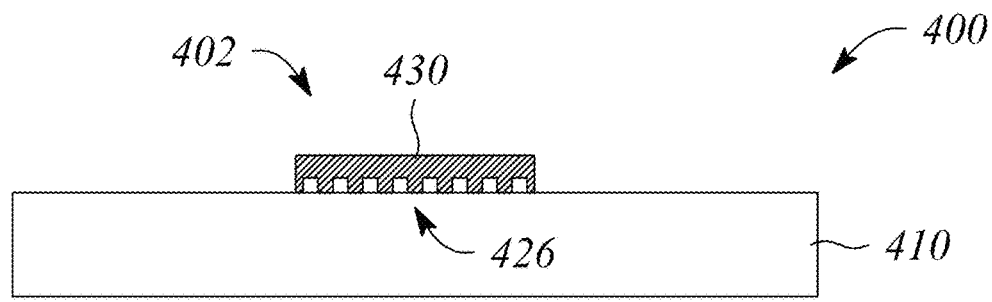

In various embodiments, the exposed portion 424 may be removed to define a grating element 426 of the diffractive backlight 400. In particular, in some embodiments, the exposed portion 424 may be removed by covering the universal grating 420 and the reflective island 430 with a layer of optical material 440 that index-matched to a material of the universal grating 420, as illustrated in FIG. 6C. As described above, the optical material 440 has a refractive index that is substantially similar to a refractive index of the universal grating 420 such that covering the universal grating 420 effectively eliminates any diffractive features thereof in the exposed portion 424. In other embodiments, as illustrated in FIG. 6D, the exposed portion 424 of the universal grating 420 may be removed by etching the exposed portion 424 using the reflective island 430 as an etch mask.

Removal of the exposed portion 424 selects the portion 422 of the universal grating as the grating element 426. According to some embodiments, the removal of the exposed portion 424 may represent selecting 130, 330 a portion of the universal grating 420 using the reflective island 430 to define the grating element, as described with respect to the method 100, 300 of fabricating a diffractive backlight. For example, in FIG. 6C the reflective island 430 effectively protects the covered portion 422 to select and define the grating element 426 when the optical material layer is applied, while in FIG. 6D the reflective island 430 selects and defines the grating element 426 by acting as an etch resist preventing the covered portion 422 from being etched away.

Once defined, the grating element 426 in conjunction with the reflective island 430 may represent a reflective diffraction grating element 402 of the diffractive backlight 400. In some embodiments (e.g., FIG. 6C), the reflective diffraction grating element 402 is embedded in a light guide that comprises the light guide substrate 410 and the layer of optical material 440. In other embodiments (e.g., FIG. 6D), the reflective diffraction grating element 402 may be on or at a surface of the light guide substrate 410 that serves as the light guide of the diffractive backlight 400.

Figure 6E:
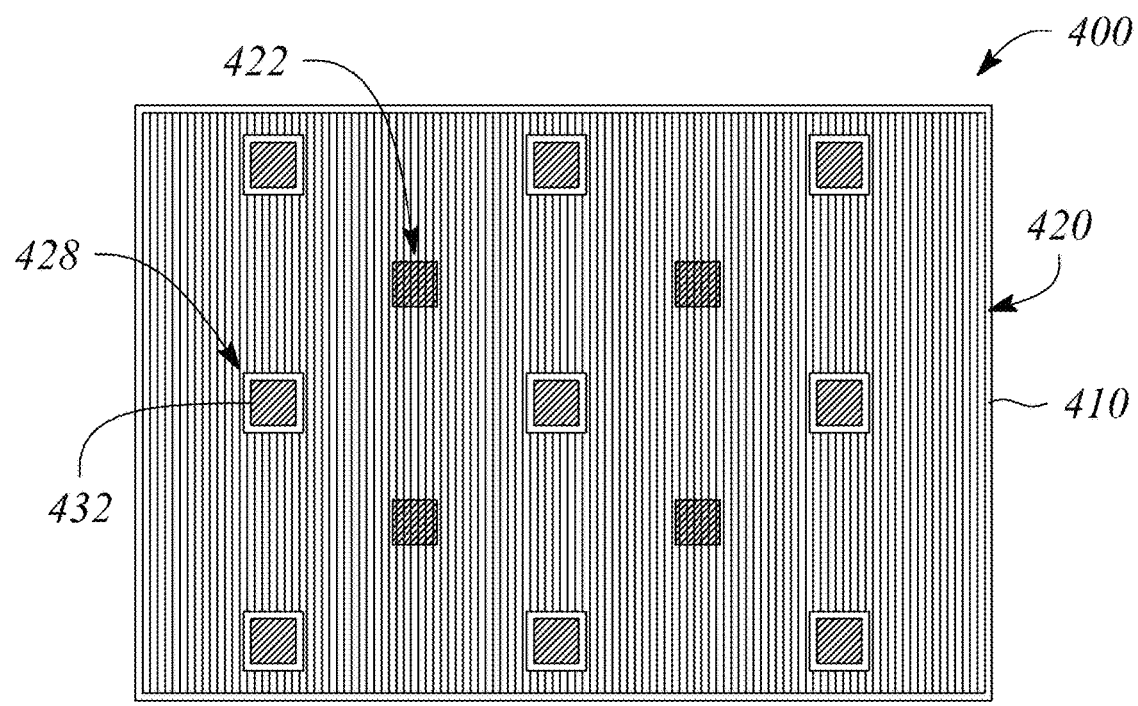
Figure 6F:
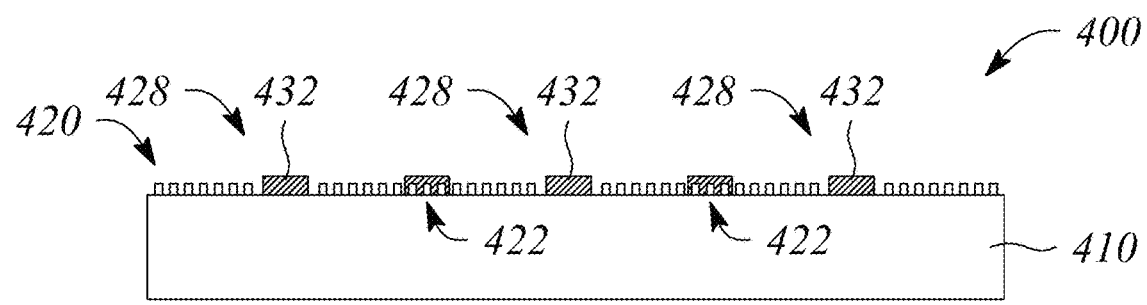
Figure 6G:
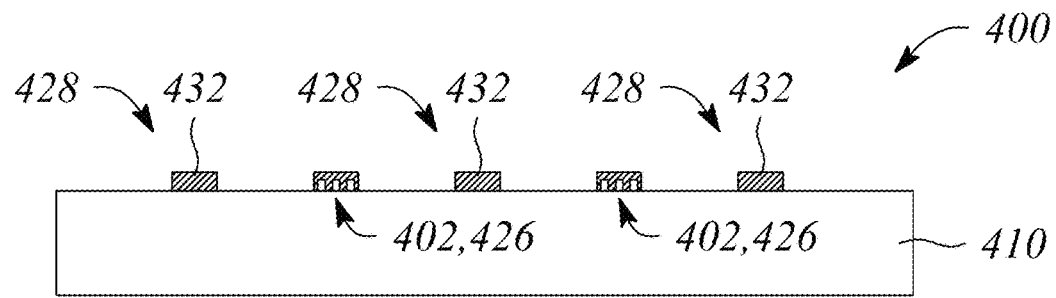

In some embodiments, the universal grating 420 may comprise openings in the universal grating 420. In addition, a layer of reflective material may be deposited in the openings to provide reflective islands that are not part of or included in a reflective diffraction grating element, in some embodiments. FIG. 6E illustrates a top view and FIG. 6F illustrates a side view of the diffractive backlight 400 depicting a plurality of openings 428 in the universal grating 420. Also illustrated are reflective islands 432 located within each opening 428 of the opening plurality, by way of example and not limitation. As illustrated in FIG. 6F, the reflective islands 432 within the openings 428 do not cover any of the universal grating 420 and therefore are not part of a reflective diffraction grating element. On the other hand, following selection and definition of the grating element 426, the reflective island 430 and the grating element 426 (including a covered portion of the universal grating) are part of a reflective diffraction grating element 402, as illustrated in FIG. 6G.

Figure 7A:
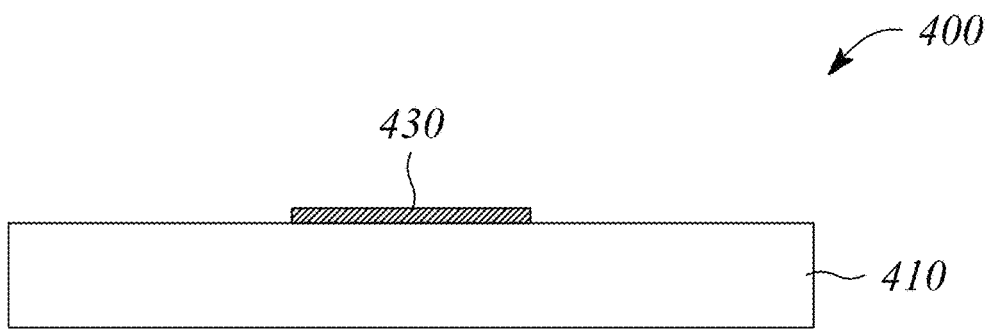
FIGS. 7A-7F illustrate cross sectional views of fabricating a diffractive backlight in another example, according to an embodiment of the principles described herein.

FIGS. 7A-7F illustrate cross sectional views of fabricating a diffractive backlight 400 in another example, according to an embodiment of the principles described herein. As in FIGS. 6A-6F, the diffractive backlight 400 illustrated in FIGS. 7A-7F comprise the light guide substrate 410. Further, FIG. 7A illustrates the reflective island 430 formed on a surface of the light guide substrate 410. The reflective island 430 and forming same may be substantially similar to the reflective island provided by forming 120, 210 a reflective island on a light guide substrate or light guide of the above-described method 100, 200 of fabricating a diffractive backlight, according to some embodiments.

Figure 7B:
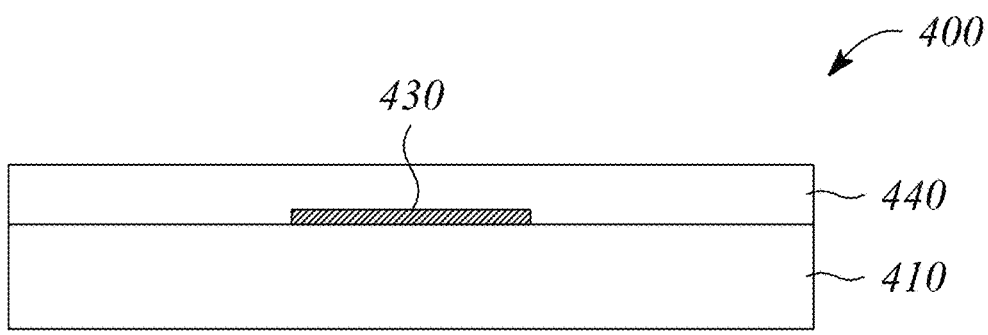

FIG. 7B illustrates the light guide substrate 410 and reflective island 430 of the diffractive backlight 400 covered by a layer of optical material 440 that has been deposited on the light guide substrate 410 and over the reflective island 430. As illustrated, the optical material 440 may be index-matched to the light guide substrate 410, i.e., the optical material 440 may have a refractive index that is substantially similar to a refractive index of the light guide substrate 410. In some embodiments, the layer of optical material 440 may be deposited on the light guide substrate 410 according to depositing 220 a layer material of the above-described method 200 of fabricating a diffractive backlight.

Figure 7C:
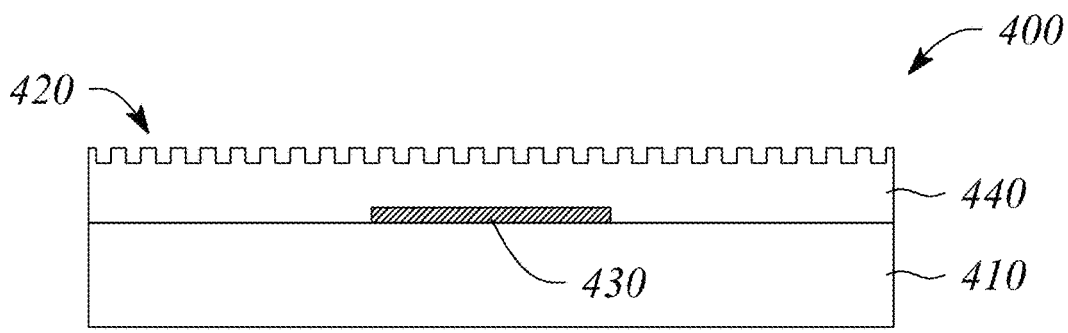

FIG. 7C illustrates a universal grating 420 provided or formed in a receiving layer of the optical material 440. In some embodiments, a surface of the layer of optical material 440 may serve as the receiving layer. In other embodiments (not illustrated), another layer of material may be provided on or applied to the optical material surface to serve as the receiving layer. The universal grating 420 may be provide or formed according to forming 110, 230, 310 a universal grating of method 100, 200, 300 of fabricating a diffractive backlight, as described above.

Figure 7D:
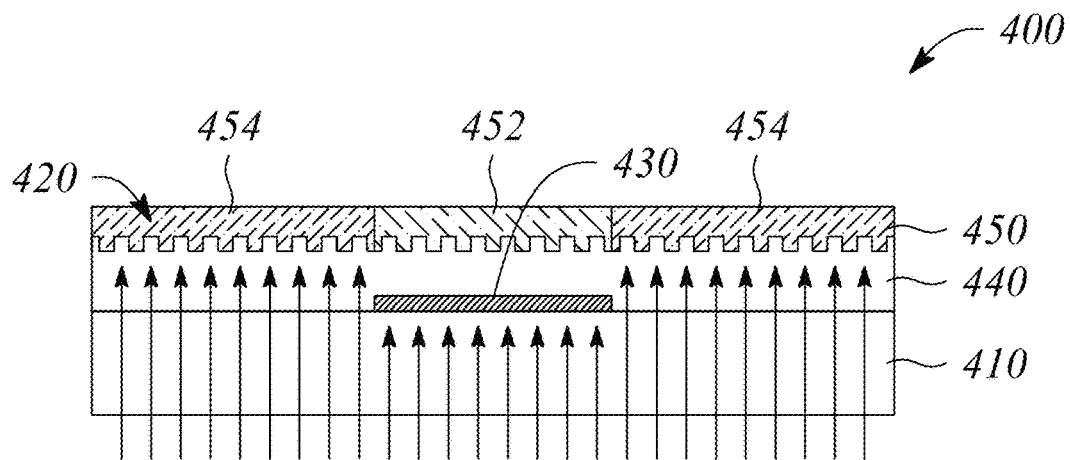

FIG. 7D illustrates a positive photoresist 450 applied over the universal grating 420. Also illustrated are arrows representing exposure of the positive photoresist 450 using a collimated light source to illuminate the positive photoresist 450 from a side of the light guide substrate 410 that is opposite to a side on which the reflective island 430 is located. As illustrated, the reflective island 430 serves as a photomask to define a portion 452 of the positive photoresist 450 that remains after the positive photoresist 450 is developed. Another portion 454 of the photoresist is removed by developing the positive photoresist 450. In particular, as illustrated in FIG. 7D, the reflective island 430 blocks some light (arrows) from the collimated light source, preventing the blocked light from reaching and illuminating (i.e., exposing) the portion 452 of the positive photoresist 450 that is immediately above the reflective island 430, as illustrated. The other portion 454 of the positive photoresist 450 is exposed to the light from the light source, as illustrated, allowing the other portion 454 to be removed during when the positive photo resist is developed.

Figure 7E:
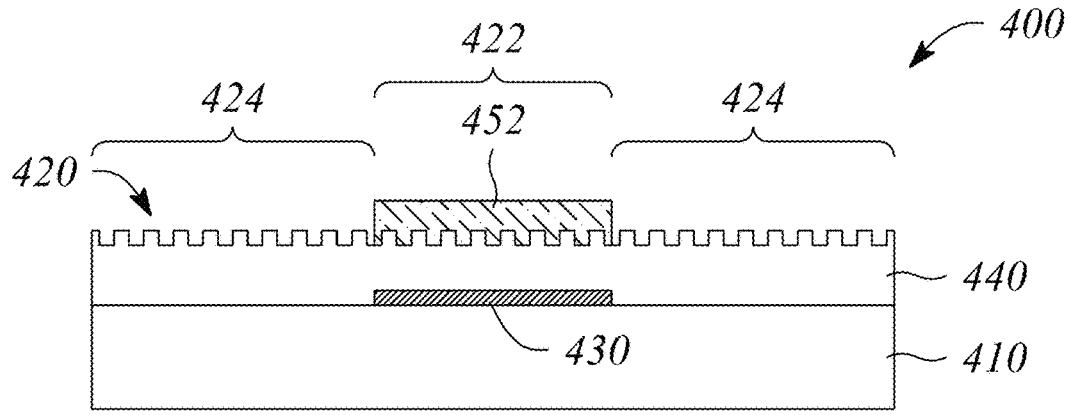

FIG. 7E illustrates the portion 452 of the positive photoresist 450 that remains after the positive photoresist 450 is developed. The remaining portion 452 covers and protects a portion 422 of the universal grating 420, while other portions 424 of the universal grating 420 are not protected and therefore are exposed portions 424. According to various embodiments, the portion 422 of the universal grating 420 may be selected, or more particularly further selected, to define the grating element 426 by removing the exposed portions 424 of the universal grating 420 not covered by the remaining portion 452 of the positive photoresist 450. For example, the exposed portion 424 of the universal grating 420 may be removed by etching.

Figure 7F:
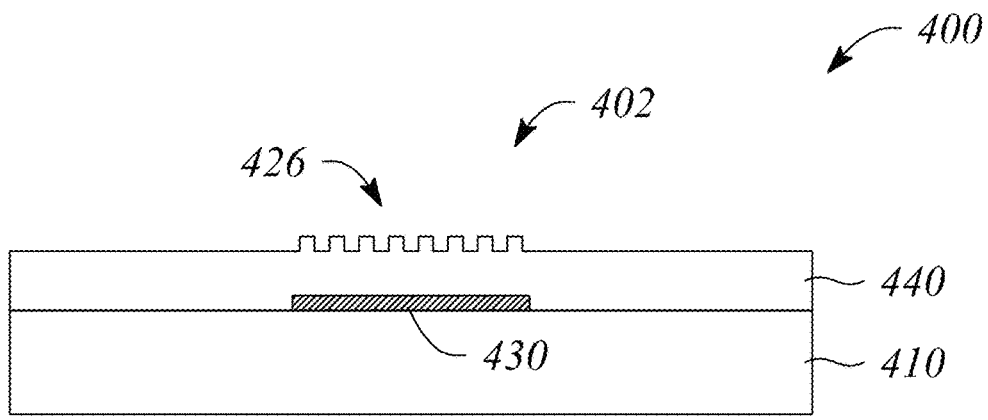

FIG. 7F illustrates the diffractive backlight 400 following removal of the remaining portion of positive photoresist. As illustrated in FIG. 7F, the reflective diffraction grating element 402 comprises the reflective island 430 below and aligned with the grating element 426.

Figure 8A:
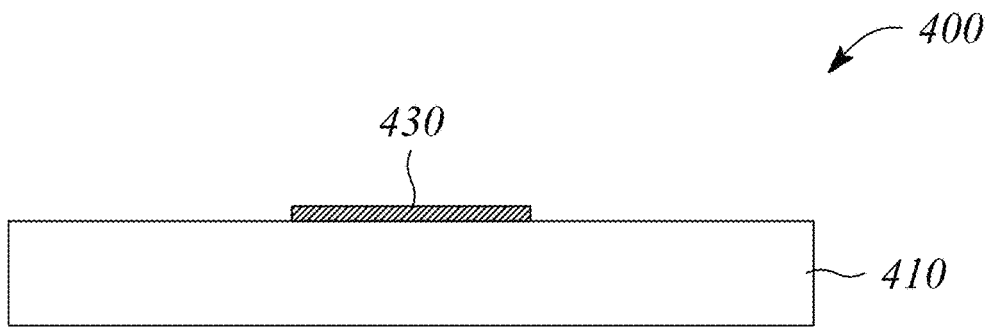
FIGS. 8A-8G illustrate cross sectional views of fabricating a diffractive backlight in yet another example, according to an embodiment of the principles described herein.

FIGS. 8A-8G illustrate cross sectional views of fabricating a diffractive backlight 400 in yet another example, according to an embodiment of the principles described herein. As in FIGS. 6A-6F and 7A-7F, the diffractive backlight 400 illustrated in FIGS. 8A-8G comprise the light guide substrate 410. Further, FIG. 8A illustrates the reflective island 430 formed on a surface of the light guide substrate 410. The reflective island 430 may be provided as described above. For example, the reflective island 430 may be formed using photolithographic patterning of a reflective material layer applied to the light guide substrate surface.

Figure 8B:
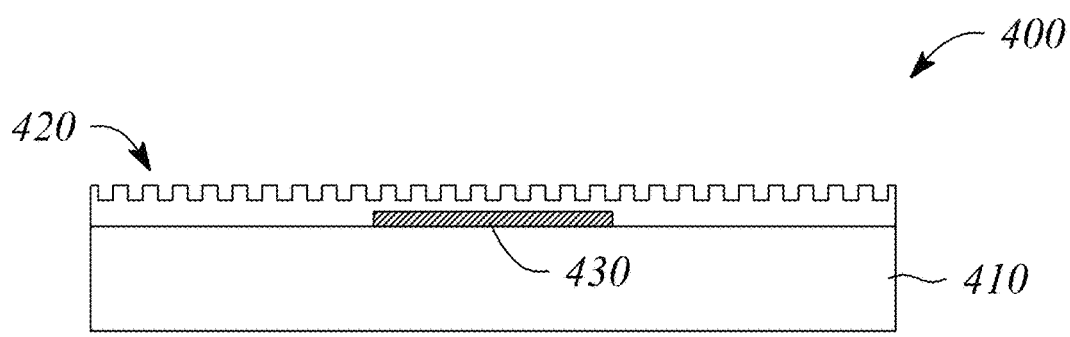

FIG. 8B illustrates the universal grating 420 provided over the reflective island 430 on the surface of the light guide substrate 410. As described above, the universal grating 420 may be provided on the light guide substrate 410 surface using nanoimprint lithography. For example, a receiving layer comprising an optical material layer (e.g., a layer of the index-matched optical material 440) may be deposited on the light guide substrate 410 surface and over the reflective island. Then a nanoimprint mold may be used to nanoimprint the universal grating 420, for example.

Figure 8C:
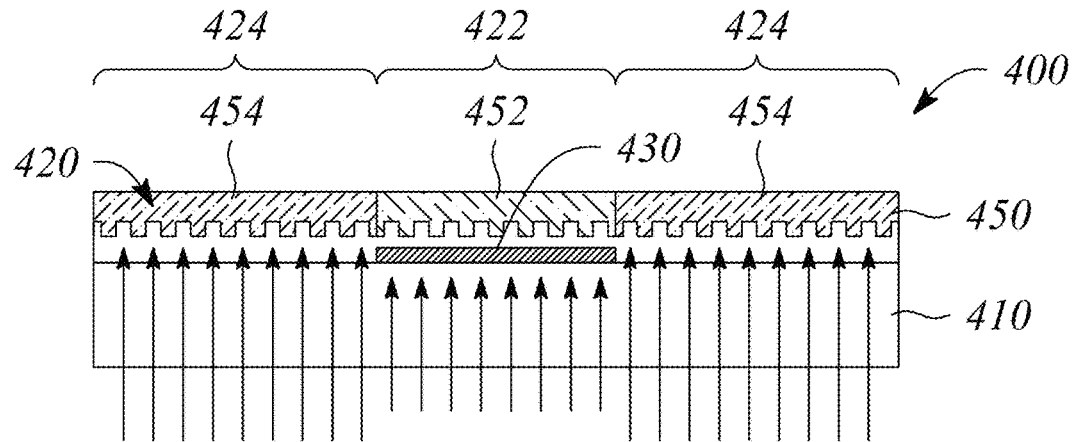

As illustrated in FIG. 8C, a positive photoresist 450 may be applied over the universal grating 420 and the reflective island 430 may be used as a photomask to define a portion 452 of the positive photoresist 450 that remains after the positive photoresist is developed. For example, FIG. 8C illustrates arrows representing exposure of the positive photoresist 450 using a collimated light source to illuminate the positive photoresist 450 from a side of the light guide substrate 410 that is opposite to a side on which the reflective island 430 is located, e.g., as described above with respect to FIG. 7D. Also, as described previously, another portion 454 of the photoresist is removed by developing the positive photoresist 450 to leave the remaining portion 452. Further, as described above, the remaining portion 452 selects the portion 422 of the universal grating 420 to define the grating element 426.

Figure 8D:
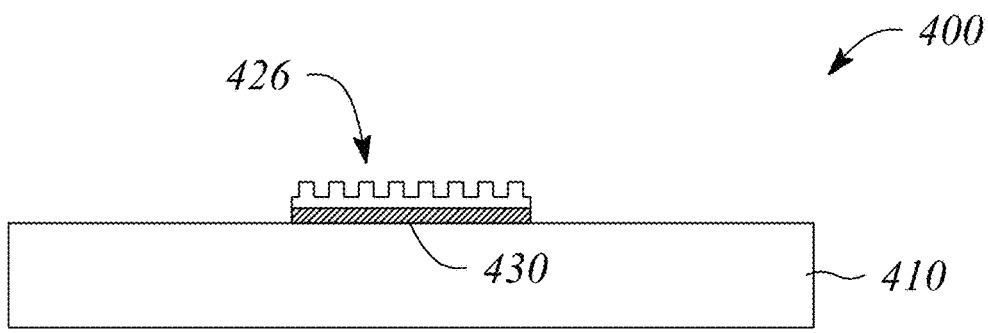

FIG. 8D illustrates the grating element 426 after removal of the exposed portion of the universal grating 420 that is not covered by the remaining portion 452 of the positive photoresist 450 following photoresist development. Etching may be used to remove the exposed portion to provide the grating element 426 on the reflective island 430, as illustrated.

According to some embodiments, the grating element 426 may be coated with a layer of reflective material. The reflective material layer may be relatively thin such that coating of the grating element 426 preserves a diffraction grating of the grating element 426 in the reflective material layer, according to various embodiments.

Figure 8E:
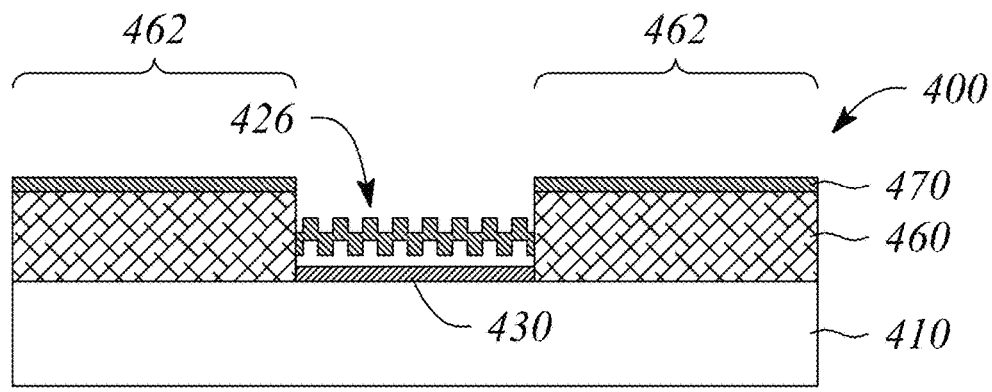

FIG. 8E illustrates using a negative photoresist 460 that is exposed using the collimated light as described above followed by deposition of the reflective material 470 to provide a reflective material layer coating on the grating element 426. In particular, developing the negative photoresist 460 after using the reflective island 430 as a photomask exposes the grating element 426. The reflective material 470 may then be deposited using sputtering, evaporative deposition, or a similar method to coat both the exposed portion 462 of the negative photoresist 460 and the exposed grating element 426.

Figure 8F:
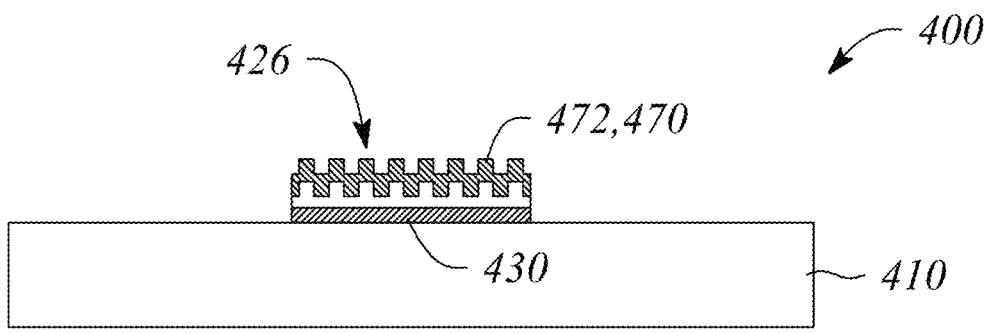

As illustrated in FIG. 8F, removal of the exposed portion 462 of the negative photoresist 460 and concomitant lift-off of reflective material 470 that is not covering the grating element 426, leaves behind the reflective island 430 and the grating element 426 with a coating of the reflective material 470. A thickness of the negative photoresist 460 may be chosen to support lift-off of the reflective material 470 on the exposed portion 462 of the negative photoresist 460, according to various embodiments.

Figure 8G:
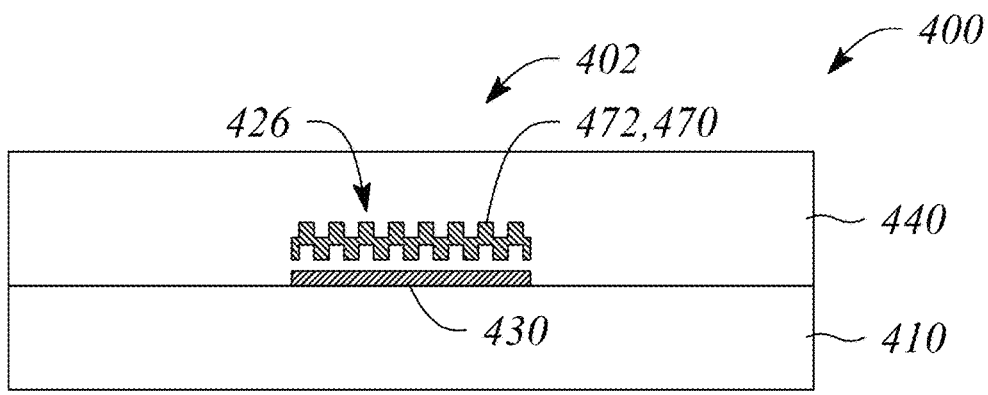

FIG. 8G illustrates the diffractive backlight 400 after deposition of an index-matched optical material 440 to cover the reflective island 430 and reflective material-coated grating element 426, according to some embodiments. As illustrated, a light guide of the diffractive backlight 400 comprise a combination of the index-matched optical material 440 and light guide substrate 410. Further, a reflective diffraction grating element 402 of the diffractive backlight 400 comprises the reflective island 430 and the aligned grating element 426 with the coating of the reflective material 470.

Figure 9A:
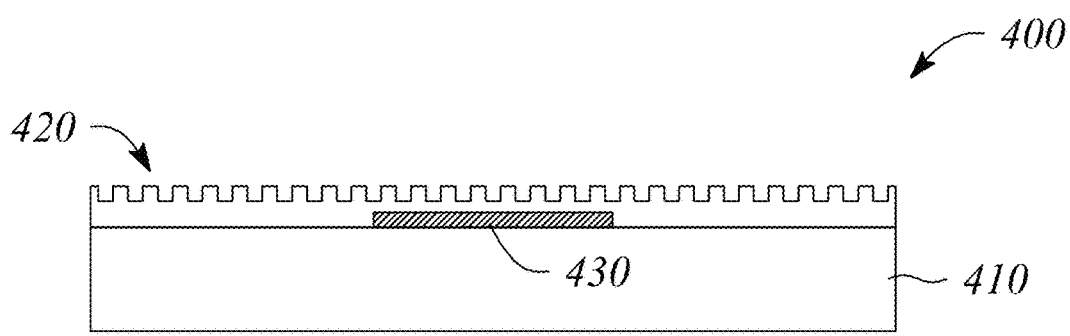
FIGS. 9A-9E illustrate cross sectional views of fabricating a diffractive backlight in yet another example, according to an embodiment of the principles described herein.

FIGS. 9A-9E illustrate cross sectional views of fabricating a diffractive backlight 400 in yet another example, according to an embodiment of the principles described herein. FIG. 9A illustrates the light guide substrate 410 and reflective island 430 of the diffractive backlight 400 covered by a universal grating 420, e.g., as described with respect to FIGS. 8A-8B above. The universal grating 420 may be provide or formed according to forming 110, 230, 310 a universal grating of method 100, 200, 300 of fabricating a diffractive backlight, as described above. In particular, nanoimprint lithography using a nanoimprint mold may be used to form the universal grating 420, for example.

Figure 9B:
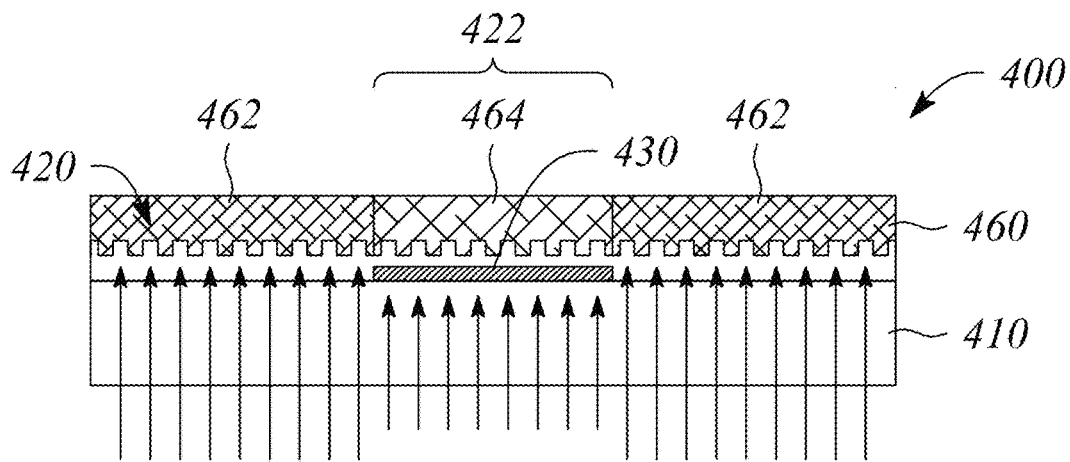

FIG. 9B illustrates a negative photoresist 460 that has been applied over the universal grating 420. Also illustrated are arrows representing exposure of the negative photoresist 460 using a collimated light source to illuminate the negative photoresist 460 from a side of the light guide substrate 410 that is opposite to a side on which the reflective island 430 is located. As illustrated, the reflective island 430 serves as a photomask to define the exposed portion 462 that remains after the negative photoresist 460 is developed. Another portion 464 of the negative photoresist 460 is removed by developing the negative photoresist 460 to expose a portion 422 of the universal grating 420 that is aligned with the reflective island 430. As a result, the reflective island 430 is used to select the portion 422 and define the grating element 426.

Figure 9C:
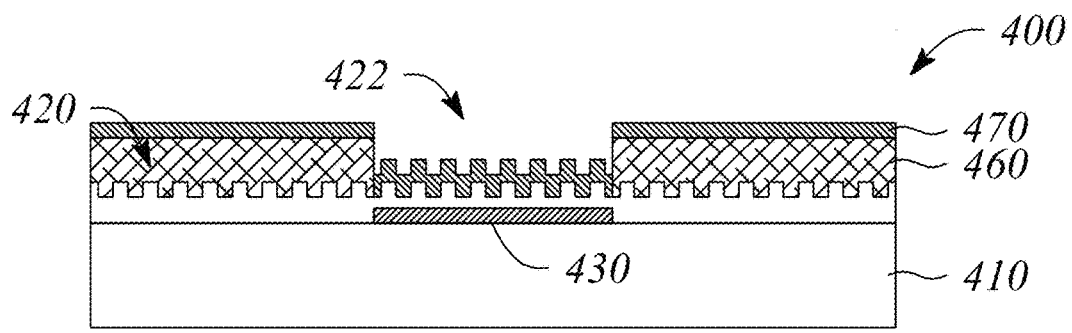

FIG. 9C illustrates a layer of reflective material 470 deposited on the negative photoresist 460 and exposed portion 422 of the universal grating 420. As above, the reflective material 470 may be thin enough to preserve a diffraction grating of the universal grating in the deposited reflective material layer.

Figure 9D:
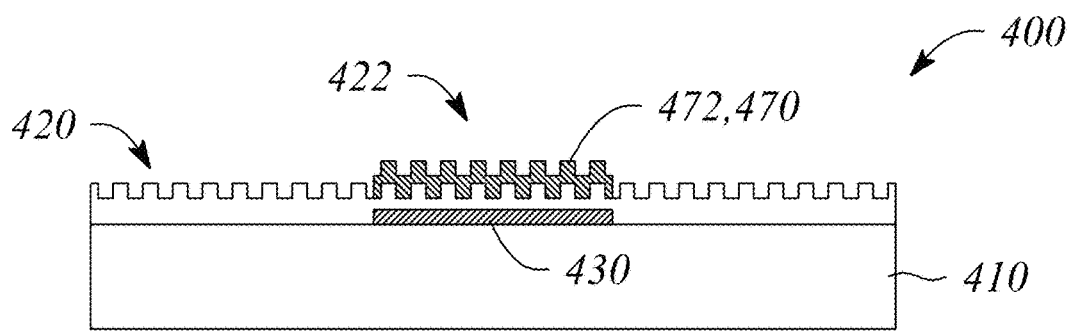

FIG. 9D illustrates a portion 472 of the reflective material layer that remains on the universal grating 420 following removal of the exposed portion 462 of the negative photoresist 460 and concomitant lift-off of the reflective material 470. As illustrated, the remaining portion 472 of the reflective material layer is aligned with the reflective island and effectively defines the grating element 426. That is, exposure of the negative photoresist 460 using the reflective island 430 as a photomask, followed by deposition and lift-off of the reflective material layer selects the portion 422 of the universal grating 420 and defines the grating element 426.

Figure 9E:
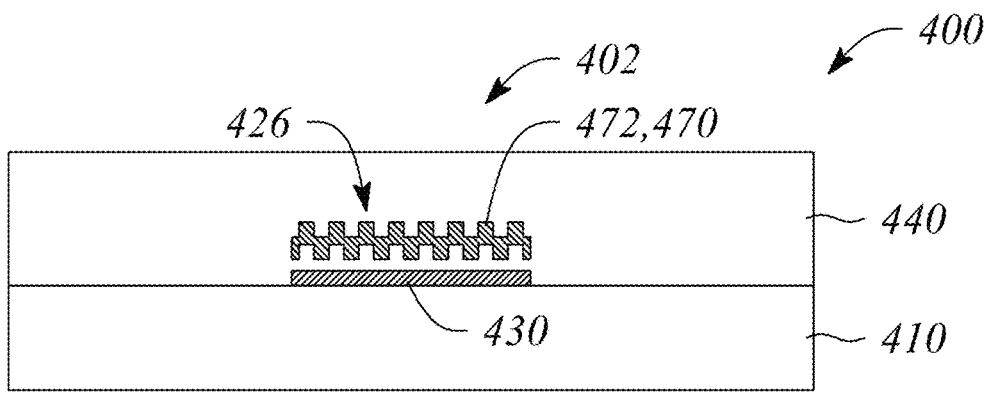

FIG. 9E illustrates the diffractive backlight 400 after deposition of an index-matched optical material 440 to cover the reflective island 430 and reflective material-coated grating element 426. As illustrated, a light guide of the diffractive backlight 400 comprise a combination of the index-matched optical material 440 and light guide substrate 410. Further, a reflective diffraction grating element 402 of the diffractive backlight 400 comprises the reflective island 430 and the aligned grating element 426 with the coating of the reflective material 470.

Thus, there have been described examples and embodiments of several methods of fabricating a diffractive backlight that employ a reflective island to select a portion of a universal grating as or to define a grating element, wherein the reflective island and the grating element comprise a reflective diffraction grating element of the diffractive backlight. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of fabricating a diffractive backlight, the method comprising:
    forming a reflective island on a surface of a light guide substrate;
    forming a universal grating over the reflective island on the surface of the light guide substrate; and
    selecting a portion of the universal grating using the reflective island to define a grating element by:
        applying a photoresist to cover the universal grating;
        exposing the photoresist using a collimated light source to illuminate the photoresist from a side of the light guide substrate that is opposite to a side on which the reflective island is located, the photoresist being a positive photoresist and the reflective island serving as a photomask to define a portion of the photoresist that remains after the photoresist is developed; and
        removing an exposed portion of the universal grating not covered by the photoresist that remains,
    wherein a reflective diffraction grating element of the diffractive backlight comprises a combination of the grating element and the reflective island.

2. The method of fabricating a diffractive backlight of claim 1, wherein forming the universal grating on the light guide substrate comprises nanoimprinting the universal grating in a nanoimprint receiving layer of the light guide substrate using a nanoimprint mold.

3. The method of fabricating a diffractive backlight of claim 1, wherein forming the reflective island comprises patterning a layer of reflective material to define the reflective island, the layer of reflective material comprising one or more of a metal, a metal polymer, and a high-index dielectric.

4. The method of fabricating a diffractive backlight of claim 1, further comprising providing an optical material layer between the reflective island and the universal grating, wherein the optical material layer is index-matched to a material of the light guide substrate, the universal grating being formed on the optical material layer.

5. The method of fabricating a diffractive backlight of claim 1, wherein removing the exposed portion of the universal grating comprises etching the exposed portion to remove material of the universal grating not covered by the photoresist.

6. The method of fabricating a diffractive backlight of claim 1, further comprising:
    applying a negative photoresist to cover reflective island and the grating element;
    exposing the negative photoresist using the collimated light source to illuminate the negative photoresist and define an opening in the photoresist above the grating element; and
    depositing a reflective material on the grating element through the opening in the photoresist,
    wherein the reflective material exclusively covers the grating element.

7. The method of fabricating a diffractive backlight of claim 6, further comprising depositing a layer of optical material on the light guide substrate, the optical material layer embedding the grating element, the reflective island, and the reflective material covering the grating element, wherein removing the exposed portion of the universal grating comprises the exposed portion being covered by the optical material layer.

8. A method of fabricating a diffractive backlight, the method comprising:
    forming a reflective island on a surface of a light guide, the reflective island comprising one or more of a metal, a metal polymer, and a high-index dielectric;
    depositing a layer of optical material on the light guide to cover the reflective island, the optical material being index-matched to a material of the light guide;
    forming a universal grating on the optical material layer using nanoimprint lithography; and
    selecting a portion of the universal grating using the reflective island to define a grating element by:
        applying a photoresist to cover the universal grating; and
        exposing the photoresist using a collimated light source to illuminate the photoresist from a side of the light guide that is opposite to a side on which the reflective island is located, the reflective island serving as a photomask to define a portion of the photoresist that remains after the photoresist is developed,
    wherein selecting a portion of the universal grating to define the grating element comprises one of etching an exposed portion of the universal grating not covered by the photoresist that remains and covering the exposed portion of the universal grating with a layer of the optical material,
    wherein a reflective diffraction grating element of the diffractive backlight comprises a combination of the grating element and the reflective island.

9. The method of fabricating a diffractive backlight of claim 8, further comprising depositing a reflective material layer on the grating element and further covering the deposited reflective material layer with a layer of the optical material.

* * * * *